United States Patent [19]

Matsumoto

[11] Patent Number: 4,585,528
[45] Date of Patent: Apr. 29, 1986

[54] METHOD OF PROVIDING THROUGH HOLE PLATING BETWEEN CIRCUIT ELEMENTS

[75] Inventor: Hirofumi Matsumoto, Ibaraki, Japan

[73] Assignee: Nippon Mektron Ltd., Japan

[21] Appl. No.: 594,988

[22] Filed: Mar. 29, 1984

[30] Foreign Application Priority Data

Mar. 30, 1983 [JP] Japan ................................ 58-55517

[51] Int. Cl.⁴ .......................... H05K 3/42; H05K 3/46
[52] U.S. Cl. ...................... 204/15; 427/97; 427/282
[58] Field of Search ................ 427/97, 282; 204/15

[56] References Cited

U.S. PATENT DOCUMENTS 3,134,690 5/1964 Eriksson ........................... 427/97

FOREIGN PATENT DOCUMENTS 1924775 6/1971 Fed. Rep. of Germany .
1665771 5/1975 Fed. Rep. of Germany .

*Primary Examiner*—John D. Smith
*Attorney, Agent, or Firm*—Fishman & Dionne

[57] ABSTRACT

A method of providing through-hole plating between flexible circuit elements and rigid circuit elements is presented wherein a strong and reliable electrical connection is affected without damage to the conductive pattern of the flexible circuit elements. The method includes selectively providing removable masking material to portions of a flexible circuit element followed by nonelectrolytic plating and subsequent removal of the mask. An additional resist layer is also provided to selective areas followed by electrolytic plating and subsequent removal of the resist material.

4 Claims, 7 Drawing Figures

METHOD OF PROVIDING THROUGH HOLE PLATING BETWEEN CIRCUIT ELEMENTS

BACKGROUND OF THE INVENTION

This invention relates to the field of circuit elements. More particularly, this invention relates to a method of providing through-holes through circuit elements so as to connect a rigid or hard circuit element to a flexible circuit element, the circuit elements being connected at the through-holes.

A typical procedure for providing a through-hole passage through a plurality of circuit elements generally includes the formation of corresponding holes through which the elements may be connected. Thereafter, the plural circuit elements are electrically connected at the through-hole passage via a nonelectrolytic plating procedure followed by an electrolytic plating procedure whereby the passage is thickened. However, when one of the circuit elements is a flexible circuit element, material from the nonelectrolytic plating treatment may be deposited uniformly to the circuit pattern and/or part of the substrate of the flexible circuit in the vicinity of the through-hole. As a result, the flexibility of the flexible circuit may be adversely decreased. In order to avoid this undesirable decrease in flexibility, the electroplated layer must be removed from the flexible circuitry layer after the nonelectrolytic plating treatment to thereby leave only the through-hole passageway coated. Unfortunately, it will be appreciated that the conventional method for removing such a coating from flexible circuit substrates is generally complex. Moreover, there is danger that the circuit pattern will be damaged during this removal process. Thus, the prior art method of electrically connecting flexible and rigid circuit elements at a through-hole has many problems from at least the standpoints of cost and reliability.

SUMMARY OF THE INVENTION

The above-discussed and other problems of the prior art are overcome or alleviated by the through-hole connecting method of the present invention. In accordance with the present invention, a novel method for making through-hole passage connections through rigid and flexible circuit elements is provided wherein the above discussed problems are essentially eliminated. The method of the present invention comprises, in part, providing a selective portion or the flexible circuit element with a masking material which can be easily peeled off, i.e., adhesive tape, such that the mask material can be conveniently removed after the nonelectrolytic plating treatment. This masking will be applied to the circuit pattern of the flexible circuit element at all points where the flexible circuit is exposed to the nonelectrolytic plating treatment except for the actual site at which the through-hole is to be provided, i.e., the "land region".

Preferably, following the nonelectrolytic plating treatment, a resistive agent is provided at selected areas and the flexible circuit is then exposed to an electrolytic plating treatment to thicken the through-hole connection. Thereafter, both the resistive agent and the masking material are removed without damage to the circuit pattern on the flexible circuit. The method of the present invention provides a strong mechanical and electrical connection between a rigid circuit element and a flexible circuit element without impairing the flexibility of the flexible circuitry. Also, the present invention may be provided with relative ease and at a relatively low cost.

The above discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several Figures.

DESCRIPTION OF THE PREFERRED EMBODIMENT

Figure 1:
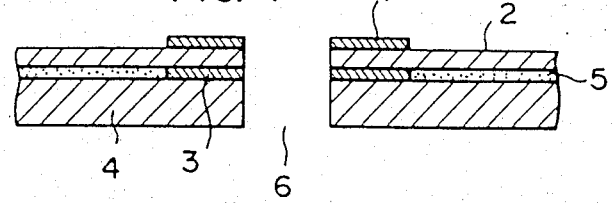
FIG. 1 is a cross sectional elevation view of a first step in accordance with the method of the present invention.
Figure 2:
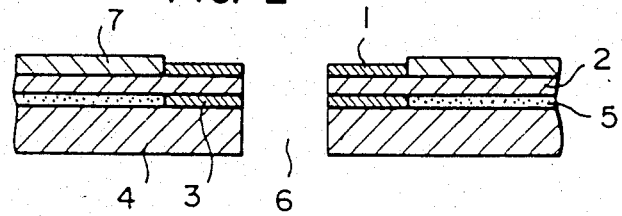
FIG. 2 is a cross sectional elevation view of a second step in accordance with the method of the present invention.

FIGS. 1–7 are cross sectional views showing successive steps in accordance with the method of the present invention. Referring first to FIG. 1, a flexible circuit substrate 2 having a circuit pattern 1 thereon is shown disposed above and adhesively connected by adhesive 5 to a rigid circuit substrate 4 having a circuit pattern 3 thereon. A through-hole 6 has been provided at a selected area through both circuit patterns 1 and 3 and substrates 2 and 4. As a result, each circuit pattern 1 and 3 has a land region defined about the perimeter of through-hole 6. As shown then, land regions of circuit patterns 1 and 3 are spatially disposed on top of one another separated by substrate 2.

After the through-hole passage 6 has been provided through each circuit element (by any standard procedure), flexible circuit substrate 2 is covered with a masking material 7 which is capable of being easily peeled off, such as, for example, masking tape. This masking material 7 is provided on substrate 2 at all points where the substrate 2 is exposed to the nonelectrolytic plating treatment except for the land region of the circuit pattern 1. (See FIG. 2).

Figure 3:
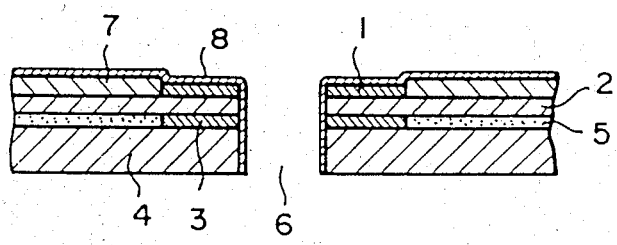
FIG. 3 is a cross sectional elevation view of a third step in accordance with the method of the present invention.

Referring now to FIG. 3, a nonelectrolytic plating treatment is performed wherein a nonelectrolytic plated layer 8 having a desired thickness is formed on the inside surfaces of through-hole 6, the land region of conductive pattern 1 and masking material 7.

Figure 4:
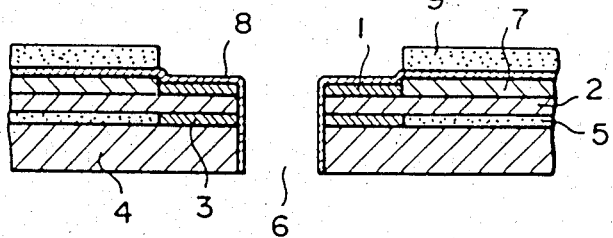
FIG. 4 is a cross sectional elevation view of a fourth step in accordance with the method of the present invention.
Figure 5:
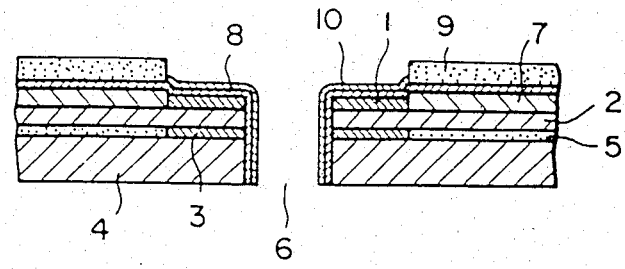
FIG. 5 is a cross sectional elevation view of a fifth step in accordance with the method of the present invention.

Preferably, through-hole passage 6 is further thickened by the method shown in FIGS. 4–7. In FIG. 4, a suitable resist layer 9 is provided at selected regions of nonelectrolytic plated layer 8. Note that resist layer 9 is on adhesive material 7 but is again not disposed over the land region of conductive pattern 1. Thereafter, and as shown in FIG. 5, an electrolytic plated layer 10 is uniformly applied to the nonelectrolytic plated layer 8 along the land region of conductive pattern 1 and the through-hole passage 6. At this point, a strong and reliable electrical and mechanical through-hole passage connection has been effected between the two land regions of conductive patterns 1 and 3.

Figure 6:
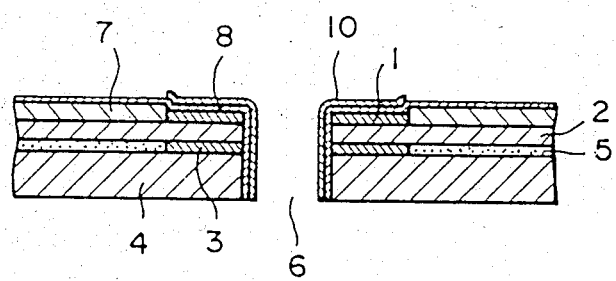
FIG. 6 is a cross sectional elevation view of a sixth step in accordance with the method of the present invention.
Figure 7:
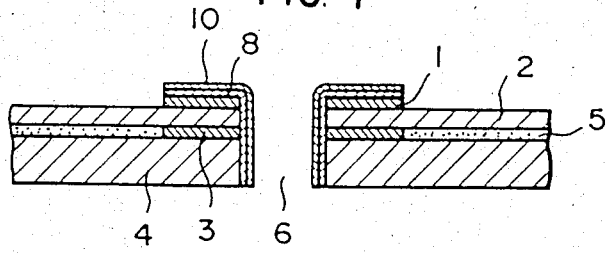
FIG. 7 is a cross sectional elevation view of a seventh step in accordance with the method of the present invention.

Referring now to FIG. 6, resist layer 9 is preferably removed via a suitable solvent or the like. Next, as shown in FIG. 7, masking material 7 which is disposed upon nonelectrolytic plating layer 8 is easily removed by mechanical stripping or peeling to leave the plated through-hole. In accordance with the method of the present invention, there is no danger that damage will occur to the circuit pattern 1 of the flexible circuit substrate 2. This is unlike the above discussed prior art methods wherein damage typically occurs to the flexible printed circuit element. Thus, the method of the present invention provides an efficient and convenient method wherein a through-hole connection can be affected between a rigid and flexible circuit element.

In accordance with the method of providing through-hole plating of the present invention, masking material 7 is fixed to the flexible circuit element prior to the nonelectrolytic plating treatment, the masking material being peeled off the flexible circuit element subsequent thereto. It will be appreciated that the above described method of the present invention is relatively simple and straightforward. Moreover, masking material 7 serves the function of protecting the circuit pattern 1 of the flexible circuit right up until any final processes. This method therefore, is extremely convenient relative to more complicated prior art methods. Because the resist layer 9 is formed on the nonelectrolytic plating layer 8, there is also no danger of damage to the conductive pattern 1 of the flexible circuit element when the resistive layer 9 is removed. Thus, in accordance with the method of the present invention, resistive layer 9 can be simply and easily utilized without risk of damage to the flexible circuit.

An important feature and improvement of the method of the present invention, is that a through-hole connection between a rigid circuit element and a flexible circuit element may be easily and quickly effected without impairing the flexibility of the flexible circuit substrate. Moreover, as discussed earlier, the present invention also provides a high quality electrical connection at a relatively low cost without any danger of damage to the circuit patterns of the flexible circuit substrate.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of providing a through-hole connection between a flexible circuit element and a rigid circuit element, the flexible circuit element including a flexible substrate having a conductive pattern thereon and being adhesively or otherwise connected to and disposed above the rigid circuit element, the rigid circuit element including a rigid substrate having a conductive pattern thereon, including the steps of:
   providing a through-hole passage through said flexible and rigid circuit elements, the perimeter of said through-hole passage defining land regions of said respective conductive patterns;
   providing removable masking material to all of said flexible circuit element other than at least said land region of said conductive pattern;
   providing a nonelectrolytic plating layer to at least said through-hole passage, said land region of said flexible circuit element and said masking material;
   providing a resist layer to all of said nonelectrolytic plated layer other than at least said land region of said conductive pattern;
   providing an electrolytic plating layer to at least said through-hole passage, said land region of said flexible circuit element and said nonelectrolytic plated layer;
   removing said resist layer; and
   removing said masking material.

2. The method of claim 1 wherein:
said masking material is adhesive tape.

3. A method of providing a through-hole connection between a flexible circuit element and a rigid circuit element, the flexible circuit element including a flexible substrate having a conductive pattern thereon and being adhesively or otherwise connected to and disposed above the rigid circuit element, the rigid circuit element incuding a rigid substrate having a conductive pattern thereon, including the steps of:
   providing a through-hole passage through said flexible and rigid circuit element, the perimeter of said through-hole passage defining land regions of said respective conductive patterns;
   providing removable masking material to all of said flexible circuit element other than at least said land region of said conductive pattern, said removable masking material being peelable from said flexible circuit element;
   providing a nonelectrolytic plating layer to at least said through-hole passage, said land region of said flexible circuit element and said masking material;
   providing a resist layer to all of said nonelectrolytic plated layer other than at least said land region of said conductive pattern;
   providing an electrolytic plating layer to at least said through-hole passage, said land region of said flexible circuit element and said nonelectrolytic plated layer;
   removing said resist layer; and
   removing said masking material wherein said masking material is peeled from said flexible circuit element.

4. The method of claim 3 wherein:
said masking material is adhesive tape.

* * * * *